United States Patent
Khorenko et al.

(10) Patent No.: US 9,899,548 B2
(45) Date of Patent: Feb. 20, 2018

(54) SOLAR CELL UNIT

(71) Applicant: Azur Space Solar Power GmbH, Heilbronn (DE)

(72) Inventors: Victor Khorenko, Neuenstadt a. K. (DE); Ivica Zrinscak, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 200 days.

(21) Appl. No.: 14/611,543

(22) Filed: Feb. 2, 2015

(65) Prior Publication Data
US 2015/0144189 A1    May 28, 2015

Related U.S. Application Data

(63) Continuation of application No. PCT/EP2013/002168, filed on Jul. 22, 2013.

(30) Foreign Application Priority Data

Jul. 31, 2012 (EP) .................... 12005554

(51) Int. Cl.
*H01L 31/048* (2014.01)
*H01L 31/0232* (2014.01)
(Continued)

(52) U.S. Cl.
CPC .... *H01L 31/02327* (2013.01); *H01L 27/1421* (2013.01); *H01L 31/0203* (2013.01);
(Continued)

(58) Field of Classification Search
None
See application file for complete search history.

(56) References Cited

U.S. PATENT DOCUMENTS 8,093,492 B2    1/2012  Hering et al.
2009/0120500 A1   5/2009  Prather et al.
(Continued)

FOREIGN PATENT DOCUMENTS

DE    10 2009 006 286 A1    10/2009
DE    10 2011 084054 A1    6/2012
(Continued)

OTHER PUBLICATIONS

Andreev et al., "Development of PV Receivers for Space Line-Focus Concentrator Modules," IEEE Photovoltaic Spec. Conf., pp. 341-344 (May 13, 1996).

*Primary Examiner* — Magali P Slawski
(74) *Attorney, Agent, or Firm* — Muncy, Geissler, Olds & Lowe, P.C.

(57) ABSTRACT

A solar cell unit having a semiconductor body formed as a solar cell, whereby the semiconductor body has a front side with a first electrical connection and a back side with a second electrical connection and a side surface formed between the front side and the back side, and having a substrate with a top side and a bottom side, whereby the substrate on the top side has a first conductive trace region, configured as part of the substrate, and the first electrical connection is electrically connected to the first conductive trace region, and the substrate on the top side has a second conductive trace region, configured as part of the substrate, and the second electrical connection is electrically connected to the second conductive trace region, and having a secondary optical element, which has a bottom side and guides light to the front side of the semiconductor body.

17 Claims, 3 Drawing Sheets

(51) Int. Cl.
*H01L 31/02* (2006.01)
*H01L 31/054* (2014.01)
*H01L 27/142* (2014.01)
*H01L 31/0203* (2014.01)

(52) U.S. Cl.
CPC ...... *H01L 31/02008* (2013.01); *H01L 31/048* (2013.01); *H01L 31/0543* (2014.12); *Y02E 10/52* (2013.01)

(56) References Cited

U.S. PATENT DOCUMENTS

| | | | |
|---|---|---|---|
| 2009/0209691 A1* | 8/2009 | Tsuchida | C08G 77/26 524/398 |
| 2011/0155217 A1* | 6/2011 | Yang | H01L 31/02168 136/246 |
| 2011/0240096 A1 | 10/2011 | Maheshwari | |
| 2012/0187439 A1 | 7/2012 | Bösch et al. | |
| 2013/0320376 A1* | 12/2013 | Hasin | H01L 31/18 257/98 |

FOREIGN PATENT DOCUMENTS

| | | |
|---|---|---|
| EP | 1 953 825 A2 | 8/2008 |
| EP | 2 073 279 A1 | 6/2009 |
| EP | 2 278 631 A1 | 1/2011 |
| EP | 2 312 646 A1 | 4/2011 |

* cited by examiner

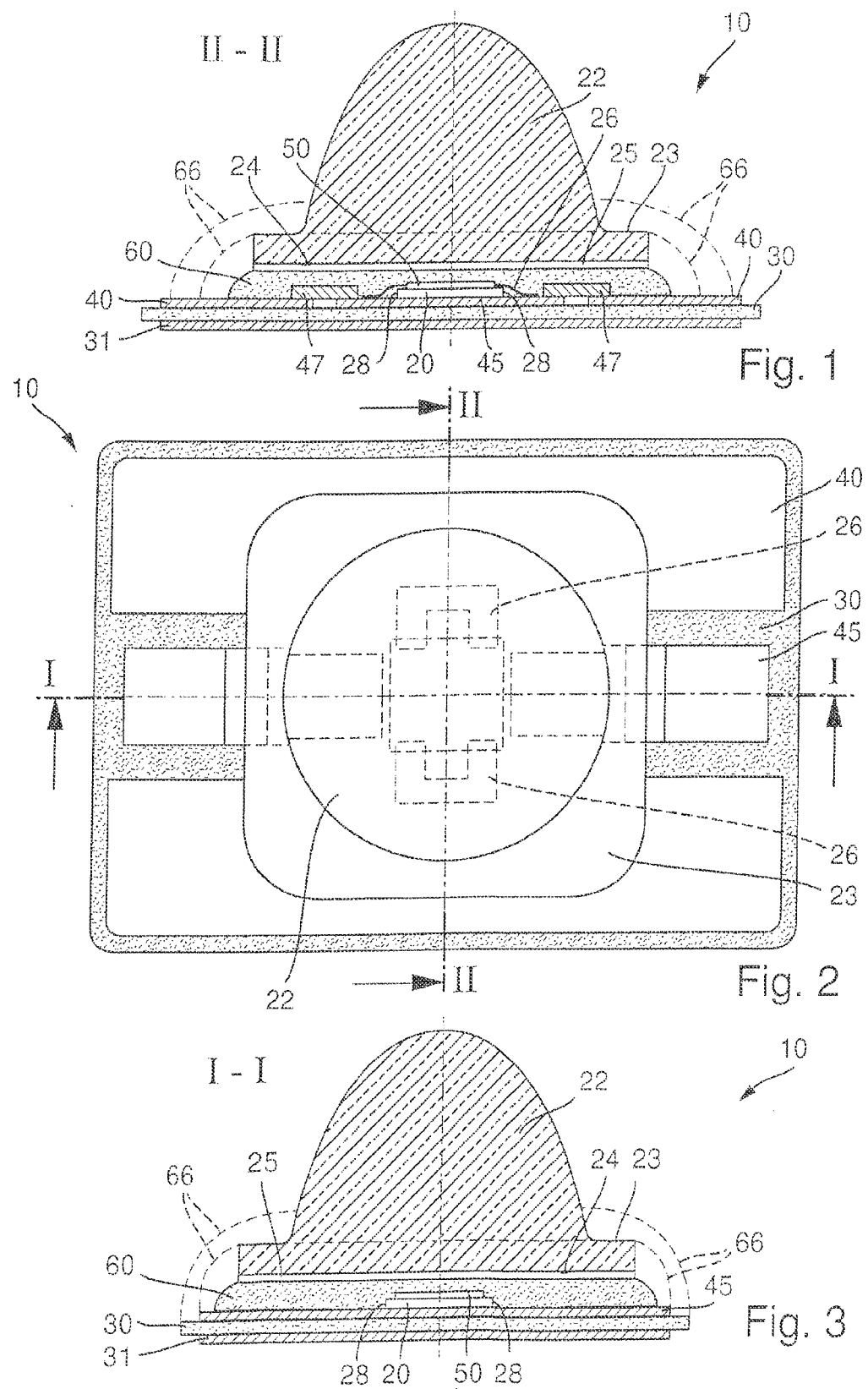

SOLAR CELL UNIT

This nonprovisional application is a continuation of International Application No. PCT/EP2013/002168, which was filed on Jul. 22, 2013 and which claims priority to European Patent Application No. EP 12005554.6, which was filed on Jul. 31, 2012, and which is herein incorporated by reference.

BACKGROUND OF THE INVENTION

Field of the Invention

The present invention relates to a solar cell unit.

Description of the Background Art

A solar cell module is known from EP 2 073 279 A1, which corresponds to US 2010/0132793, in which a semiconductor body formed as a solar cell is arranged on a substrate. In order to protect the semiconductor body and particularly the side surfaces thereof from environmental influences, which lead to a degradation of the electrical parameters, a frame is arranged on four sides around the semiconductor body and closed with a transparent cover. Next, the remaining interspace is filled with a transparent sealing compound and an optical element is attached.

Another solar cell unit is known from EP 1 953 825 A2, which corresponds to U.S. Pat. No. 7,264,378. In this case, a semiconductor body formed as a solar cell is arranged on a substrate. Then, to protect the semiconductor body a sealing film and a package, which consists of a number of parts and also comprises an optical element, are arranged on the substrate in a multistep process.

A solar cell unit is known from DE 10 2009 006 286 A1, which corresponds to U.S. Pat. No. 8,093,492, and which has a plurality of individual solar cells on a substrate. Inter alia, an optical element, which is also called a secondary optical element "SOE," is arranged above the solar cell. The optical element guides the sunlight focused by a Fresnel lens to the surface of the solar cell. Large-area solar cell units can be constructed by means of the focusing arrangement with a few small solar cells with an efficiency up to 40% and higher.

SUMMARY OF THE INVENTION

It is therefore an object of the invention to provide a device that refines the prior art.

According to an embodiment of the invention, a solar cell unit having a semiconductor body formed as a solar cell is disclosed, whereby the semiconductor body has a front side with a first electrical connection and a back side with a second electrical connection and a side surface formed between the front side and the back side, and having a substrate with a top side and a bottom side, whereby the substrate on the top side has a first conductive trace region, configured as part of the substrate, and the first electrical connection is electrically connected to the first conductive trace region, and the substrate on the top side has a second conductive trace region, configured as part of the substrate, and the second electrical connection is electrically connected to the second conductive trace region, and having a secondary optical element, which has a bottom side and guides light to the front side of the semiconductor body, and the optical element has a planar surface on the entire bottom side, and part of the planar surface is arranged above the front side of the semiconductor body and part of the bottom side of the optical element has a first adhesion-promoting layer connected by material bonding to the bottom side, and whereby a polymer adhesive layer is formed at least between the adhesion-promoting layer and the front side of the semiconductor body.

The solar cell can be a III-V semiconductor solar cell with a GaAs base and the solar cell can be formed as a multijunction solar cell arranged in a stack and, inter alia, has an efficiency above 30% via the utilization of UV light components. Solar cell units of this type can be used in so-called CPV systems, among other things because of the higher manufacturing costs compared with silicon solar cells. In CPV systems, the sunlight is bundled by factors above 50. In this case, the light bundled by a primary optical concentrator or element is guided to a secondary optical element. The primary element is arranged above the secondary optical element. The light is guided from the secondary optical element through the polymer adhesive layer to the front side of the solar cell.

In order to keep the optical losses low, apart from a high UV resistance, the polymer adhesive layer should be made especially transparent also over the entire spectral range to be utilized. In addition, due to the high concentration of sunlight, high temperatures of up to 120° C. are reached on the front side of the solar cell; i.e., the polymer adhesive layer must be constructed especially temperature- and aging-resistant. It is understood that the adhesion-promoting layer has a different chemical composition in comparison with the polymer adhesive layer. Experiments have shown that even the formation of the polymer adhesive layer in the central area on the bottom side of the optical element and hereby also the front side produces a frictional connection.

An advantage of the device of the invention is that the secondary optical element has a planar surface and as a result can be manufactured simply and cost-effectively. Since a polymer adhesive layer, which comprises a silicone compound, is formed between the bottom side of the secondary optical element and the top side of the substrate or the front side of the solar cell, a frictional connection can be produced in a simple and cost-effective manner without other connecting means. Between the front side of the solar cell and the bottom side of the secondary optical element the polymer adhesive layer can be formed with a small thickness, preferably less than 2 mm, most preferably less than 0.5 mm. Experiments have shown that the adhesion between the polymer adhesive layer and the planar bottom side of the secondary optical element increases substantially with the formation of a thin adhesion-promoting layer and the reliability can be improved hereby. It is preferred to make the adhesion-promoting layer transparent and very thin; preferably the thickness is less than 0.5 mm, most preferably less than 0.05 mm. It turned out that the polymer adhesive layer has sealing properties, and the top side of the substrate and the semiconductor body and particularly the side surfaces of the semiconductor body are reliably protected by the polymer adhesive layer from environmental influences. Further experiments have shown that an additional sealing layer, which surrounds in particular the outer edge of the cushion-shaped polymer adhesive layer, becomes unnecessary. In this way, the number of manufacturing steps for producing the solar cell unit can be reduced further. An advantage of the cushion-shaped formation of the polymer adhesive layer below the planar surface is that there is no restriction for a lateral expansion of the polymer adhesive layer. An expansion or shrinking of the polymer adhesive layer both perpendicular to the direction of the top side of the substrate and also perpendicular to the direction due to a change in temperature and/or a change in moisture is hereby easily possible. This reduces the probability of a delamination between the polymer adhesive layer and the substrate.

In an embodiment, a second adhesion-promoting layer can be formed between the polymer adhesive layer and the front side of the semiconductor body, and the second adhesion-promoting layer is connected by material bonding to the front side of the semiconductor body. The reliability can be improved further with the formation of the second adhesion-promoting layer. According to an alternative embodiment, the second adhesion-promoting layer is also formed on the top side of the substrate. In a further refinement, the first adhesion-promoting layer is connected by material bonding with the entire bottom side of the secondary optical element.

In an embodiment, the polymer adhesive layer can be made as a sealing compound on the entire bottom side, whereby the front side of the semiconductor body and the side surfaces of the semiconductor body are covered form-fittingly. The polymer adhesive layer is preferably formed cushion-shaped between the bottom side of the secondary optical element and the top side of the substrate. According to an alternative embodiment, the polymer adhesive layer terminates flush with the edge on the bottom side of the secondary optical element. In a further alternative embodiment, the polymer adhesive layer projects laterally on the bottom side of the secondary optical element and preferably covers part of the side surface of the secondary optical element, said surface being adjacent to the bottom side of the secondary optical element.

According to an embodiment, a protection diode that can be formed as a bypass diode, can be arranged on the top side of the substrate and can have an electrical connection to the first conductive trace region and the second conductive trace region; i.e., the protection diode is connected to the first conductive trace region and the second conductive trace region. It should be noted that the solar cell also has a diode characteristic and the protection diode is connected antiparallel to the solar cell. The protection diode surfaces projecting from the top side of the substrate are preferably covered by the polymer adhesive layer.

In an embodiment, the substrate at least in one direction, preferably in both directions can be formed within the top side plane of the substrate, has a greater lateral extension than the secondary optical element. Experiments have shown that as a result according to a refinement the polymer adhesive layer projects laterally over the surface on the bottom side of the secondary optical element and an especially strong frictional connection of the secondary optical element with the substrate can be achieved.

In an embodiment, the secondary optical element can be configured in the shape of a half-ellipsoid and preferably has a circumferential shoulder-shaped collar. In a further embodiment, the secondary optical element is configured in the shape of a truncated pyramid or funnel. It is preferred, furthermore, to make the secondary optical element as a single piece of an inorganic material, preferably of a quartz glass compound. An advantage of the inorganic material or quartz glass compound is the very good UV transparency and the extraordinary high temperature stability and high mechanical and chemical resistance in comparison with an organic or plastic compound.

In another embodiment, a metal layer can be formed on the bottom side of the substrate as part of the substrate, whereby the metal layer is preferably not formed in a circumferential edge region directly at the edge of the substrate. An advantage of the metal layer is that compared with a substrate without a back metal layer, the heat is transferred from the top side of the substrate uniformly to the entire substrate. Experiments have shown that a higher radiation from the bottom side also occurs due to the more uniform distribution of heat. Further, when the substrate is mounted on a base, the heat transfer resistance between the base and the substrate is reduced by means of the back metal layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a cross section of an embodiment of the invention of a solar cell unit;

FIG. 2 is a plan view of the embodiment of FIG. 1 with a protection diode;

FIG. 3 is a cross-sectional view, along line I-I, of the embodiment of FIG. 2;

FIG. 4b is a cross section of the secondary optical element of FIG. 4a;

FIG. 4c is a plan view from below of the secondary optical element of FIG. 4a;

FIG. 5b is a cross section of the secondary optical element of FIG. 5a;

FIG. 5c is a plan view from below of the secondary optical element of FIG. 5a;

FIG. 6b is a cross section of the secondary optical element of FIG. 6a;

FIG. 6c is a plan view from below of the secondary optical element of FIG. 6a;

FIG. 7b is a cross section of the secondary optical element of FIG. 7a;

FIG. 7c is a plan view from below of the secondary optical element of FIG. 7a.

DETAILED DESCRIPTION

Figure 4A:
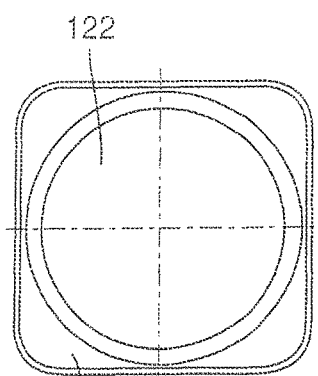
FIG. 4a is a plan view from above of a secondary optical element with an ellipsoidal shape and a shoulder-shaped collar.

The illustration in FIG. 1 shows a solar cell unit 10 with a semiconductor body 20 formed as a solar cell, a secondary optical element 22 in the shape of a half-ellipsoid with a circumferential collar-shaped bead 23. Secondary optical element 22 has a bottom side 24 and guides the light incident on secondary optical element 22 to the front side of semiconductor body 20. Optical element 22 has a planar surface on the entire bottom side 24, whereby part of the planar surface is arranged above a front side of semiconductor body 20. A first adhesion-promoting layer 25 connected by material bonding to bottom side 24 is formed on the entire bottom side 24. Substrate 30 on the bottom side has a full-surface metal layer 31 except for a narrow edge region. Substrate 30 in addition has a greater lateral extension than secondary optical element 22.

Semiconductor body 20 furthermore has a front side with a first electrical connection and a back side with a second electrical connection and a side surface 28 formed between the front side and the back side. The first electrical connection is electrically connected by means of a plurality of welded connectors 26 to first conductive trace region 40. Semiconductor body 20 is arranged with the back side on a top side of a substrate 30. A first conductive trace region 40 configured as part of the substrate is formed on the top side of substrate 30. First conductive trace region 40 is connected to the first electrical connection. Furthermore, substrate 30 on the top side has a second conductive trace region 45 configured as part of substrate 30. Second conductive trace region 45 and the second electrical connection are electrically connected to one another by soldering the back side of semiconductor body 20 to second conductive trace region 45. Also, two protection diodes are arranged on the top side of substrate 30. The protection diodes are formed as bypass diodes 47. It is understood that with a different dimensioning of the protection diode a single protection diode is sufficient as well.

A second adhesion-promoting layer 50 is formed on the front side of semiconductor body 20, and second adhesion-promoting layer 50 is connected by material bonding to the front side of the semiconductor body. In an embodiment that is not shown, second adhesion-promoting layer 50 covers at least one part of the top side of substrate 30. A silicone layer 60 is formed as a polymer adhesive layer between first adhesion-promoting layer 25 and second adhesion-promoting layer 50 or the top side of substrate 30. Silicone layer 60 form-fittingly in the form of a sealing compound completely fills the space between bottom side 24 of secondary optical element 22 and substrate 30 and produces a frictional connection between secondary optical element 22 and substrate 30. Silicone layer 60 covers both the side surfaces of semiconductor body 20 and the surfaces of both protection diodes, said surfaces projecting from the top side of substrate 30. It is understood that first adhesion-promoting layer 25 and/or second adhesion-promoting layer 50 have a different chemical composition in comparison with the polymer adhesive layer or silicone layer 60. In an alternative embodiment, shown by the dashed lines 66, silicone layer 60 projects laterally with a varying width at bottom side 24 of secondary optical element 22.

The illustration in FIG. 2 shows a plan view of the embodiment of FIG. 1. Only the differences in regard to the depiction in FIG. 1 will be explained below. It is evident that the lateral extension of secondary optical element 22 including circumferential collar 23 is smaller than the extension of substrate 30. By way of illustration, the two welded connectors 26 to which the front side of semiconductor body 20 is electrically connected are drawn as broken lines.

The illustration of FIG. 3 shows a further cross section along line I-I of the embodiment of FIG. 1. Only the differences in regard to the depiction in FIG. 1 will be explained below. It is evident that the polymer adhesive layer depending on the lateral extension, shown by dashed lines 66, is formed up to the edge of substrate 30.

Figure 4B:
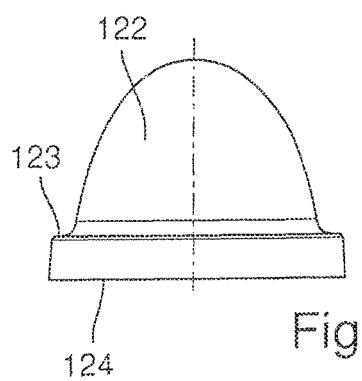
Figure 4C:
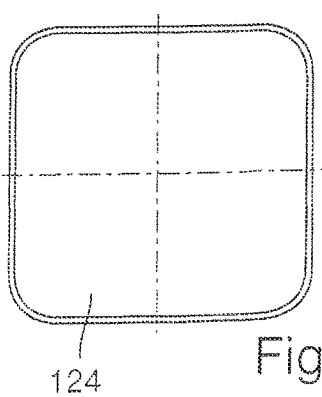

The illustration of FIG. 4a shows a plan view from above of a further embodiment of a secondary optical element with an ellipsoidal shape and a smaller shoulder-shaped collar 124 in comparison with the secondary optical element of FIG. 1. The illustration of FIG. 4b shows a cross-sectional view of the embodiment of FIG. 4a, and FIG. 4c shows a plan view from below of the secondary optical element of FIG. 4a. It is evident in the plan view from below that bottom side 124 has a planar configuration.

Figure 5A:
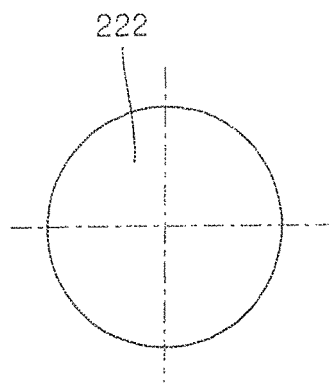
FIG. 5a is a plan view from above of a secondary optical element with an ellipsoidal shape without a shoulder-shaped collar.
Figure 5B:
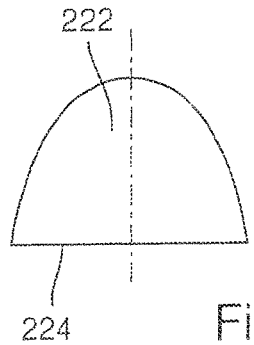
Figure 5C:
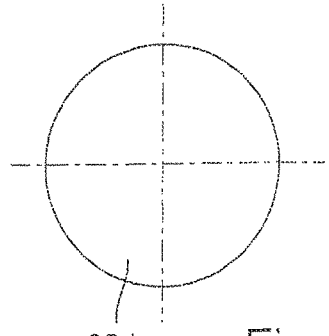

The illustration of FIG. 5a shows a plan view from above of a further embodiment of a secondary optical element 222 with an ellipsoidal shape but without a shoulder-shaped collar. The illustration of FIG. 5b shows a cross-sectional view of the embodiment of FIG. 5a, and FIG. 5c shows a plan view from below of secondary optical element 222 of FIG. 5a. It is evident in the plan view that bottom side 224 is again formed planar.

Figure 6A:
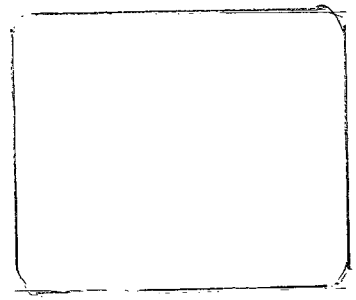
FIG. 6a is a plan view from above of a secondary optical element with a truncated pyramid shape.
Figure 6B:
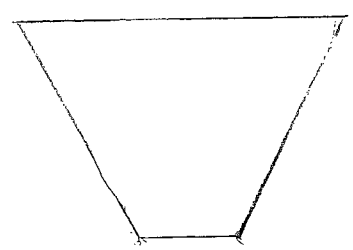
Figure 6C:
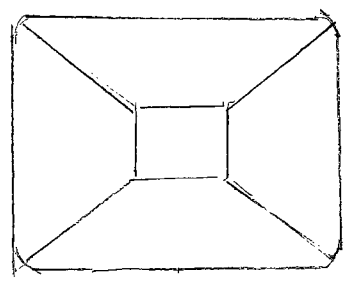

The illustration of FIG. 6a shows a plan view from above of a further embodiment of a secondary optical element 322 with a truncated pyramid shape. The illustration of FIG. 6b shows a cross-sectional view of the embodiment of FIG. 6a, and FIG. 6c shows a plan view from below of secondary optical element 322 of FIG. 6a.

Figure 7A:
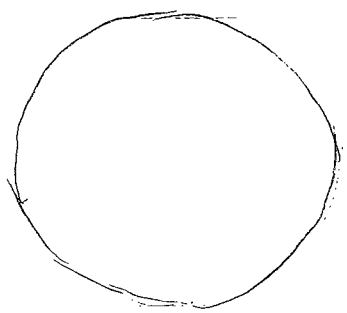
FIG. 7a is a plan view from above of a secondary optical element with a funnel shape.
Figure 7B:
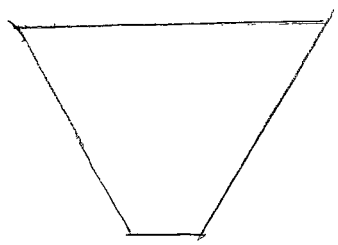
Figure 7C:
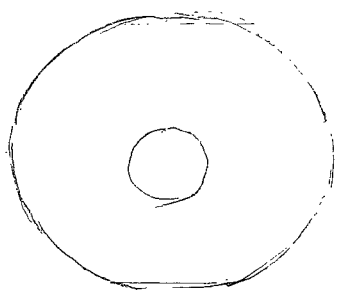

The illustration of FIG. 7a shows a plan view from above of a further embodiment of a secondary optical element 422 with a funnel shape. The illustration of FIG. 7b shows a cross-sectional view of the embodiment of FIG. 7a, and FIG. 7c shows a plan view from below of secondary optical element 422 of FIG. 7a.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell unit comprising:
   a semiconductor body formed as a solar cell and having a front side with a first electrical connection and a back side with a second electrical connection and a side surface formed between the front side and the back side;
   a substrate with a top side and a bottom side, the substrate on the top side has a first conductive trace region formed as part of the substrate, the first electrical connection being electrically connected to the first conductive trace region, and the substrate on the top side has a second conductive trace region configured as part of the substrate, the second electrical connection being electrically connected to the second conductive trace region; and
   a secondary optical element that has a completely flat bottom, the secondary optical element guiding light to the front side of the semiconductor body, the surface of the flat bottom being entirely planar on a bottom side,
   wherein a part of the planar surface is arranged above the front side of the semiconductor body,
   wherein a part of the bottom side of the secondary optical element has a first adhesion-promoting layer connected by material bonding to the bottom side and a polymer adhesive layer formed at least between the first adhesion-promoting layer and the front side of the semiconductor body,
   wherein the first electrical connection is connected to the first conductive trace region via a plurality of connectors,
   wherein the bottom side of the secondary optical element is arranged above the plurality of connectors and covers the plurality of connectors, and wherein the polymer adhesive layer encapsulates the side surface of the semiconductor body and covers the entire bottom side of the secondary optical element.

2. The solar cell unit according to claim 1, wherein a second adhesion-promoting layer is formed between the polymer adhesive layer and the front side of the semiconductor body and wherein the second adhesion-promoting layer is connected by material bonding to the front side of the semiconductor body.

3. The solar cell unit according to claim 1, wherein the polymer adhesive layer is formed as a sealing compound on the entire bottom side and covers form-fittingly the front side of the semiconductor body and the side surfaces of the semiconductor body.

4. The solar cell unit according to claim 1, wherein the first adhesion-promoting layer is connected by material bonding to the surface on the entire bottom side of the secondary optical element.

5. The solar cell unit according to claim 1, wherein the polymer adhesive layer projects laterally on the bottom side of the secondary optical element.

6. The solar cell unit according to claim 1, wherein the polymer adhesive layer covers part of the side surface adjacent to the bottom side of the secondary optical element.

7. The solar cell unit according to claim 1, wherein the polymer adhesive layer comprises a silicone compound.

8. The solar cell unit according to claim 1, wherein the first adhesion-promoting layer and/or the second adhesion-promoting layer have a different chemical composition in comparison with the polymer adhesive layer.

9. The solar cell unit according to claim 1, wherein a bypass diode is arranged on the top side of the substrate and wherein the bypass diode is arranged between the bottom side of the secondary optical element and the substrate and is completely covered by the polymer adhesive layer.

10. The solar cell unit according to claim 1, wherein the substrate has a greater lateral extension than the secondary optical element.

11. The solar cell unit according to claim 1, wherein the secondary optical element is formed in the shape of a half-ellipsoid.

12. The solar cell unit according to claim 1, wherein the secondary optical element has a circumferential shoulder-shaped collar.

13. The solar cell unit according to claim 1, wherein the secondary optical element is made as a single piece of an inorganic material or a quartz glass compound.

14. The solar cell unit according to claim 1, wherein the secondary optical element guides the light bundled by a primary optical element, formed above the secondary optical element, to the front side of the semiconductor body.

15. The solar cell unit according to claim 1, wherein the secondary optical element also has a top side, wherein a portion of the top side of the secondary optical element has a smaller diameter than a portion of the bottom side of the secondary optical element, and wherein the polymer adhesive layer extends beyond an outer edge of the bottom portion of the secondary optical element.

16. The solar cell unit according to claim 1, wherein a width of the semiconductor body is smaller than a greatest width of the secondary optical element in a direction that is perpendicular to a longitudinal axis extending through the secondary optical element and the semiconductor body.

17. The solar cell unit according to claim 1, wherein the polymer adhesive layer encapsulates at least two of the plurality of connectors.

* * * * *